United States Patent
Bowles et al.

(10) Patent No.: US 9,359,192 B1
(45) Date of Patent: Jun. 7, 2016

(54) MICROELECTROMECHANICAL SYSTEMS (MEMS) DEVICES WITH CONTROL CIRCUITS AND METHODS OF FABRICATION

(71) Applicant: Freescale Semiconductor, Inc., Austin, TX (US)

(72) Inventors: Philip H. Bowles, Gilbert, AZ (US); Mamur Chowdhury, Chandler, AZ (US); Vijay Sarihan, Paradise Valley, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/593,582

(22) Filed: Jan. 9, 2015

(51) Int. Cl.
*B81C 1/00* (2006.01)
*B81B 7/00* (2006.01)

(52) U.S. Cl.
CPC .............. *B81C 1/0023* (2013.01); *B81B 7/008* (2013.01); *B81B 2201/0235* (2013.01); *B81B 2201/0242* (2013.01); *B81B 2201/0264* (2013.01); *B81B 2207/07* (2013.01); *B81C 2203/0792* (2013.01)

(58) Field of Classification Search
CPC ...................... B81C 1/0023; B81C 2203/0792; B81B 7/008; B81B 2201/0264; B81B 2201/0235; B81B 2201/0242; B81B 2207/07
See application file for complete search history.

(56) References Cited

U.S. PATENT DOCUMENTS

| 8,250,921 | B2 | 8/2012 | Nasiri et al. |
| 2013/0320466 | A1 | 12/2013 | Chen et al. |
| 2015/0357375 | A1* | 12/2015 | Tsai ...................... B81B 7/0019 257/416 |

* cited by examiner

*Primary Examiner* — Roy Potter
*Assistant Examiner* — Paul Patton

(57) ABSTRACT

The various embodiments described herein provide microelectromechanical systems (MEMS) sensor devices and methods of forming the same. In general, the embodiments provide MEMS sensor devices formed with two semiconductor die that are bonded together. Specifically, a sensor die includes at least one MEMS sensor fabricated thereon, such as MEMS gyroscope or MEMS accelerometer. A control-circuit die includes at least one integrated MEMS control circuit formed on an active area of the die. The control-circuit die is bonded to the sensor die with the active area and the integrated MEMS control circuits on the exterior side. The bonding defines and seals a cavity between the two die that encompasses the MEMS sensor and can be used to seal the MEMS sensor in a vacuum.

20 Claims, 8 Drawing Sheets

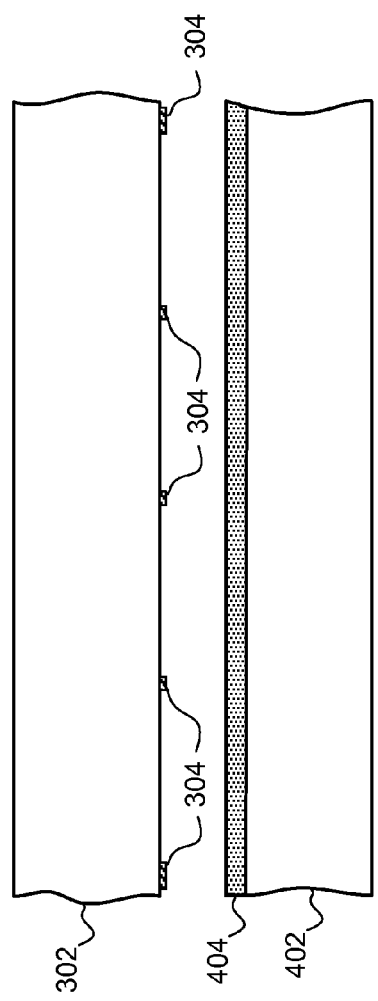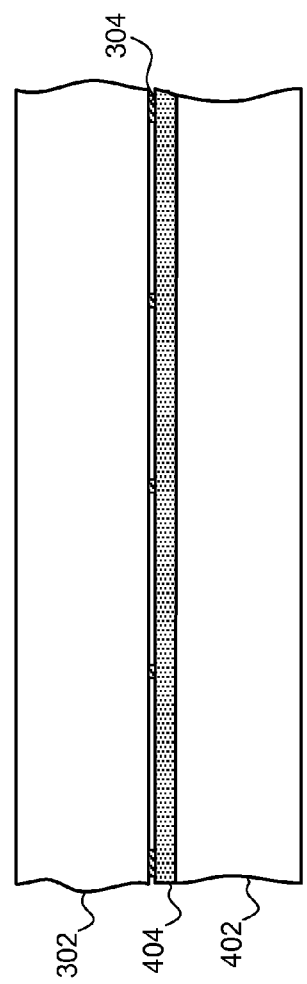

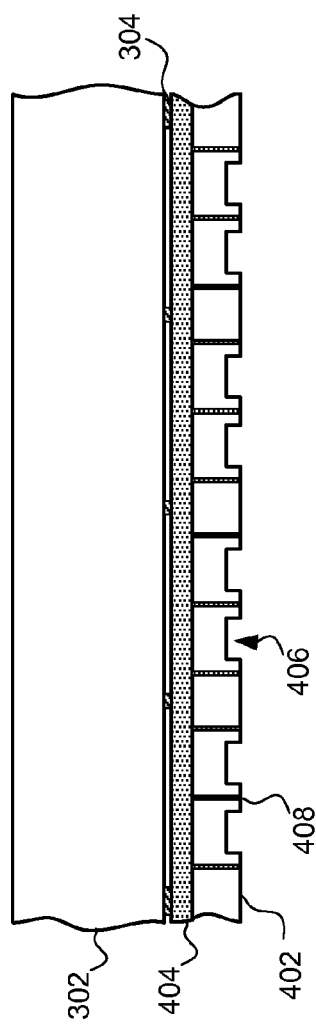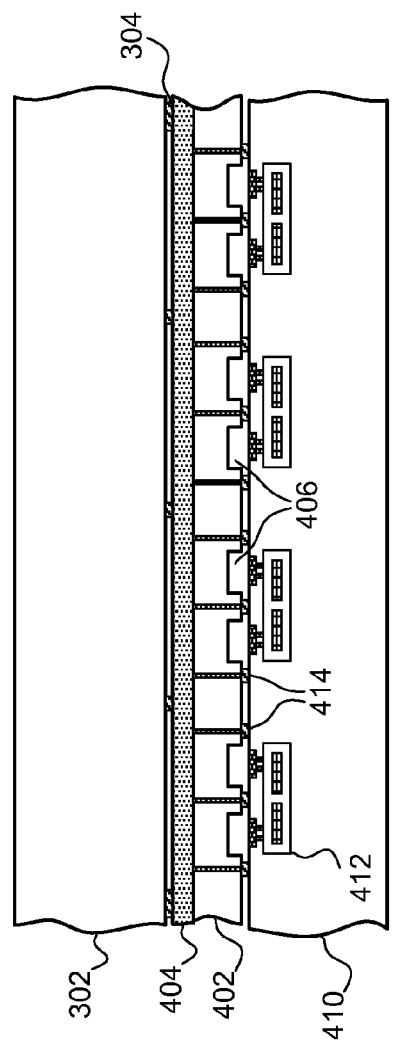

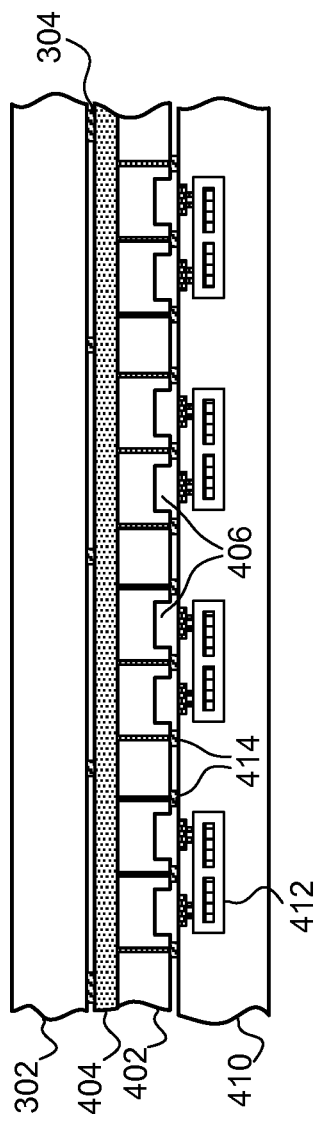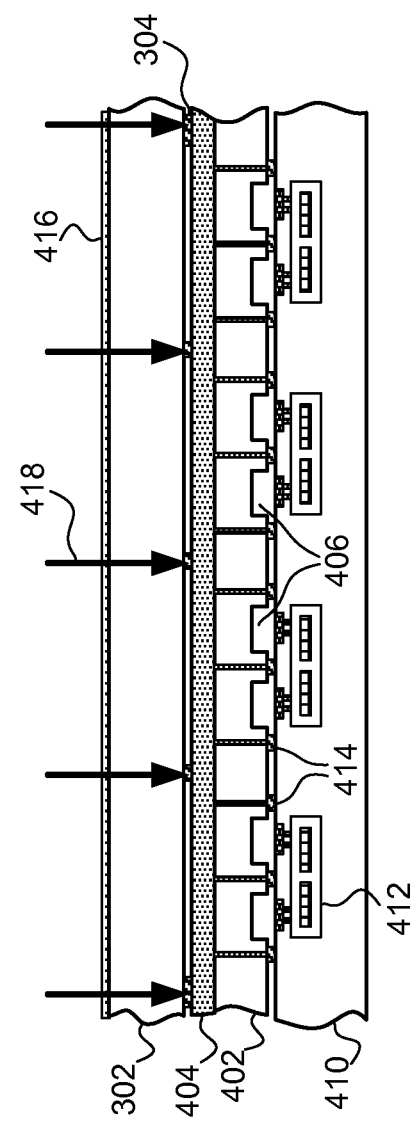

US 9,359,192 B1

MICROELECTROMECHANICAL SYSTEMS (MEMS) DEVICES WITH CONTROL CIRCUITS AND METHODS OF FABRICATION

TECHNICAL FIELD

The present invention relates generally to microelectromechanical systems (MEMS) devices. More specifically, the present invention relates to configurations and methods of forming MEMS devices.

BACKGROUND

Microelectromechanical systems (MEMS) technology has achieved wide popularity in recent years, as it provides a way to make very small mechanical structures and integrate these structures with electrical devices on a single substrate using conventional batch semiconductor processing techniques. One common application of MEMS is the design and manufacture of sensor devices. MEMS sensors are widely used in applications such as automotive, inertial guidance systems, household appliances, game devices, protection systems for a variety of devices, and many other industrial, scientific, and engineering systems. Examples of MEMS sensors include inertial sensors and pressure sensors. Specific examples of MEMS sensors include gyroscopes and accelerometers.

The manufacturing of MEMS sensors is a complex task, relying on a variety of fabrication technologies and processes, and can involve the fabrication and combination of multiple semiconductor die. For example, in many cases it is desirable to encapsulate the MEMS sensor in a cavity. Such a cavity can be formed between two dies that together form the overall sensor device. The cavity allows motion of the MEMS sensor and is generally sealed to maintain a vacuum around the MEMS sensor. The configurations and fabrication techniques used to form such MEMS sensors, and form and seal the cavities that encapsulate the MEMS sensors, can be relatively complex and subject to unacceptable failure rates. Furthermore, the configurations and fabrication techniques can require relatively large areas of the device to effectively seal the MEMS sensors, thus limiting device density.

For these and other reasons there remains a continuing need for improved MEMS sensor fabrication techniques and device configurations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3-11 are cross-sectional views of a MEMS sensor device at various stages in fabrication, in accordance with an example embodiment.

DETAILED DESCRIPTION

The various embodiments described herein can provide microelectromechanical systems (MEMS) sensor devices with reduced size, improved performance and improved reliability. In general, the embodiments provide MEMS sensor devices formed with two semiconductor die that are bonded together. Specifically, a sensor die includes at least one MEMS sensor fabricated thereon, such as a MEMS gyroscope or a MEMS accelerometer. A control-circuit die includes at least one integrated MEMS control circuit formed in an active area of the die. The control-circuit die is bonded to the sensor die with the active area and the integrated MEMS control circuits on the exterior side. The bonding defines a cavity between the two die that encompasses the MEMS sensor. Furthermore, the bonding seals the cavity and can be used to seal the MEMS sensor in a vacuum. The integrated MEMS control circuits are coupled to the MEMS sensor through a plurality of vertical interconnects that extend through the sensor die.

Configuring the MEMS sensor device with the active area and control circuits on an exterior side of a bonded die pair can provide a relatively compact device, as none of the available active area is required to be used for the seal between the dies, and instead the full active area can be used for the formation of the control circuits. Furthermore, such a configuration can provide improved performance and reliability by facilitating the effective sealing of the MEMS sensor in a vacuum between the dies.

Figure 1:
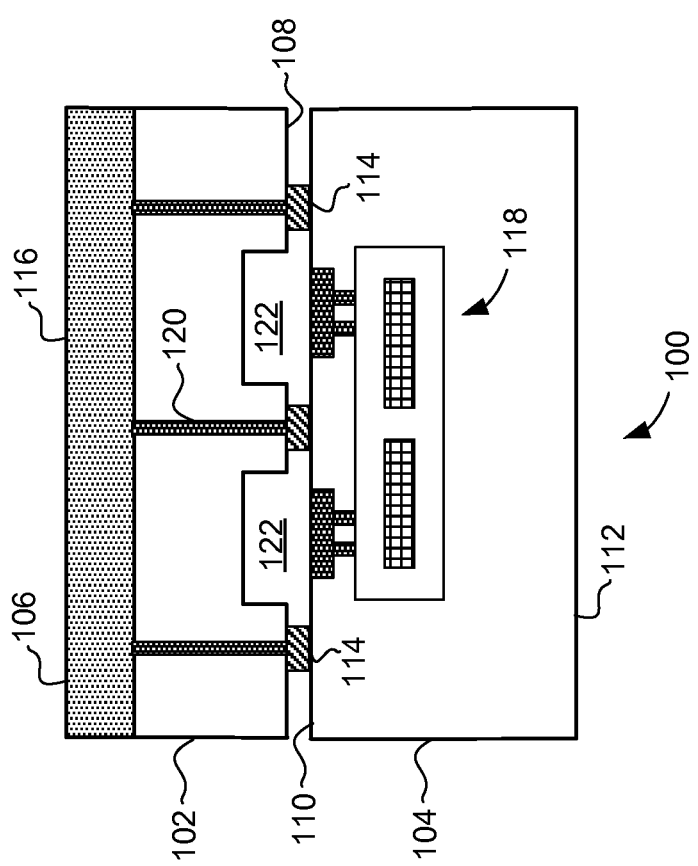
FIG. 1 is a cross-sectional view of a MEMS sensor device in accordance with an example embodiment.

Turning now to FIG. 1, a simplified cross-sectional side view of an exemplary MEMS sensor device 100 is illustrated. The MEMS sensor device 100 includes two semiconductor die that are bonded together to form a bonded die pair. Specifically, the MEMS sensor device 100 includes a control-circuit die 102 bonded to a sensor die 104. The control-circuit die 102 includes a first side 106 and a second side 108. Likewise, the sensor die 104 includes first side 110 and a second side 112.

The control-circuit die second side 108 is bonded to the sensor die 110 first side using areas of bonding agent 114. An active area 116 is formed at the control-circuit die first side 106. In active area 116 are formed the various integrated circuit devices that make up at least one integrated MEMS control circuit (not shown in FIG. 1). At least one MEMS sensor 118 is fabricated near the sensor die first side 110. Vertical interconnects 120 extend through the control-circuit die 102, from the active area 116 to the control-circuit die second side 108. These vertical interconnects 120 serve to provide at least part of the connections between the integrated MEMS control circuits and the MEMS sensor 118.

Cavities 122 are created by the bonding of the control-circuit second side 108 to the sensor side first side 110. In the illustrated embodiment, these cavities 122 include channels formed in the control-circuit second side 108, with the channels serving to enlarge the volume of the cavities 122. In addition to bonding the dies together, the bonding agent 114 forms a seal ring that serves to vacuum seal the cavities 122, allowing a vacuum to be maintained in the area around the MEMS sensor 118.

So formed, the MEMS sensor device 100 can be completed and mounted in an appropriate package (not shown in FIG. 1), with the package configured to contain the control-circuit die 102 and the sensor die 104 as a bonded die pair. In a typical embodiment, the package would provide a plurality of leads or pads used to electrically connect to the MEMS sensor device 100. A variety of different types of packages can be used, including over-molded, air cavity, wafer level and chip scale packages.

Configuring the MEMS sensor device 100 with the active area 116 on the control-circuit die first side 106, exterior to the cavities 122, can provide a relatively compact device 100.

Specifically, none of the available active area 116 is required to be covered with bonding agent 114 or otherwise used to provide the seal between the dies 102 and 104. Likewise, none of the active area 116 is required for the formation of the cavities 122. Instead, the full active area 116 can be used for the formation of the integrated MEMS control circuits and other associated devices. This can allow a greater amount of control circuits to be formed on the control circuit die 102, and in some embodiments can thus reduce or eliminate the need for additional circuits or devices external to the device.

Furthermore, such a configuration can provide improved performance and reliability by facilitating the effective sealing of the MEMS sensor 118 in a vacuum between the dies 102 and 104. Specifically, when the MEMS sensor is vacuum sealed in the cavities 122, with the active area 116 and control outside the cavities 122, no significant outgassing from the control circuits will bleed into the vacuum in the cavities 122. This can facilitate the maintaining of an effective vacuum in the cavities 122, and can thus extend and improve the reliability of the device 100.

Sensor devices such as device 100 can be fabricated with a variety of different techniques. In one embodiment, the sensor device 100 is fabricated using a carrier wafer that is temporarily bonded to a control-circuit wafer. In general, this temporary bonding of the carrier wafer to the control-circuit wafer facilitates the arrangement of the control circuits and the active area on the exterior side of the bonded control-circuit wafer and the sensor wafer. Additionally, the use of the carrier wafer facilitates the thinning of the control-circuit wafer during fabrication, something that could otherwise not be accomplished with the control circuits and the active area on the exterior side of the bonded control-circuit wafer and the sensor wafer. Furthermore, because the bonding of the wafers occurs before thinning of the control-circuit wafer, this bonding can be performed with the wafers at full thickness, thus improving the reliability of the bonding process. In specific embodiments to be described in greater detail below, this can be accomplished by bonding the carrier wafer to the control wafer at locations that correspond to die boundaries on the control-circuit wafer. This allows the process of singulating the die (e.g., sawing at the die boundaries) to also be used to separate the carrier wafer from the control-circuit wafer.

Figure 2:
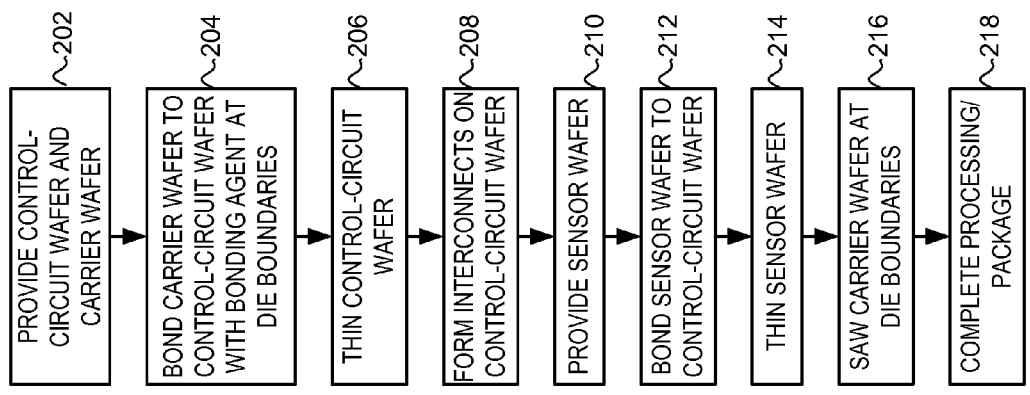
FIG. 2 is a flow diagram of a method for forming a MEMS sensor device in accordance with an example embodiment.

Turning now to FIG. 2, a method 200 of forming a MEMS sensor device is illustrated. In general, method 200 uses a carrier wafer that is temporarily bonded to a control-circuit wafer to facilitate the fabrication of a MEMS sensor device (e.g., MEMS sensor device 100 of FIG. 1) with the control circuits at an exterior side of a bonded control-circuit wafer/sensor wafer pair (e.g., control-circuit die 102 and sensor die 104). Additionally, the method 200 facilitates the bonding of the control-circuit wafer/sensor wafer pair with the wafers at full thickness, and can thus provide improved reliability of the wafer bonding process, while also facilitating later thinning of both the control-circuit wafer and the sensor wafer.

Step 202 of method 200 is to provide a control-circuit wafer and a carrier wafer, with both the carrier wafer and the control-circuit wafer including a first side and a second side. The control-circuit wafer and carrier wafer can both be formed of any suitable type, doping, size and thickness of wafer. For example, in a typical embodiment each of the control-circuit wafer and the carrier wafer can have a standard full wafer thickness sufficient to support a reliable bonding process.

The control-circuit wafer would be fabricated to include one or more active areas. In these active areas are formed a plurality of integrated MEMS control circuits used to control associated MEMS sensors. These MEMS control circuits can be formed using any suitable semiconductor fabrication process. As will be described in greater detail below, during method 200 the control-circuit wafer will be singulated into a plurality of dies, with each die including the control-circuits and other structures needed for corresponding MEMS sensors.

Because the carrier wafer will ultimately be discarded during the fabrication process, any suitable wafer can be used. In some embodiments that will be described in greater detail below, channels will be formed in the carrier wafer to facilitate the later release of the carrier wafer from the control-circuit wafer. Specifically, the channels can be formed to define ridges at the die boundaries, and as will be described in greater detail below, the bonding agent can be applied at these die boundaries.

Step 204 of method 200 is to bond the carrier wafer to the control-circuit wafer using the bonding agent at the die boundaries. In this step the bonding of the carrier wafer to the control-circuit wafer can be performed using any suitable bonding agent and technique. For example, polymeric bonding agents and metallic bonding agents can be used. It should be noted that, in this step, it is generally desirable for the bonding agent to only be applied in those areas where the wafers will be singulated, e.g., at the die boundaries or other locations where sawing will occur. As will be explained in greater detail below, when bonding agent is only used at the die boundaries the sawing of wafers at those die boundaries will likely remove all bonding agent between the wafers, thus effectively separating the carrier wafer.

Turning to FIG. 3, a cross-sectional view of a portion of an exemplary carrier wafer 302 and a portion of an exemplary control-circuit wafer 402 is illustrated. FIG. 3 also shows bonding agent 304 applied at the die boundaries of the carrier wafer 302. Again, these die boundaries correspond to the portions of the carrier wafer 302 and control-circuit wafer 402 where carrier wafer 302 will be sawed or otherwise singulated. For example, the die boundaries include the boundaries between two adjacent dies in any direction. The die boundaries can also include boundaries between one die and another portion of the wafer, such as an unused portion of the wafer. The control-circuit wafer 402 includes an active area 404 formed at a first side of the control-circuit wafer 402. Again, the active area 404 is merely exemplary, and other profiles and compositions can be formed and used.

Turning briefly to FIG. 4, a cross-sectional view of the portion of the exemplary carrier wafer 302 and the portion of the exemplary control-circuit wafer 402 are illustrated after bonding of the wafers together.

Returning to FIG. 2, step 206 of method 200 is to thin the control-circuit wafer. The thinning of the control-circuit wafer can ultimately serve to make the final control-circuit die/sensor die pair thinner, and thus can reduce the overall size of the final MEMS sensor device. Such thinning can be performed using any suitable process. For example, the thinning can be accomplished with a suitable abrasive-slurry grinding technique.

It should be noted that this thinning is performed with the control-circuit wafer bonded to the carrier wafer, and that the grinding will thus be performed on the relatively thick and stable control-circuit wafer/carrier wafer pair, with the control-circuits protected between the bonded wafer pair. Additionally, this grinding will be performed on the second side of the control-circuit wafer, opposite the control circuits formed on the first side of the control-circuit wafer. Taken together this facilitates grinding of the control-circuit wafer with a relatively low risk of damage occurring.

In step 208, interconnects are formed on the control-circuit wafer. For example, this processing can include forming vertical interconnects to provide the interconnections through the control-circuit wafer, which can be used to provide connections between the control circuits and the MEMS sensor. Such vertical interconnects can be formed with any suitable processing technique.

Likewise, step 208 can include the formation of horizontal metallization layers on the second side of the control-circuit wafer. Again, such horizontal metallization layers can be used to provide connections between control circuits and the MEMS sensor. Such horizontal metallization can be formed using any suitable fabrication techniques.

In some embodiments, it may be desirable to form channels on the second side of the control circuit wafer before, during, or after the formation of the interconnects. In such embodiments the channels can be used to provide additional space for the MEMS sensors to move. The size and shape of such channels would thus typically depend on the type and configuration of the MEMS sensor. Such channels can be formed in the second side of the control circuit using any suitable patterning and etching technique.

Turning briefly to FIG. 5, a cross-sectional view of the portion of the exemplary carrier wafer 302 and the portion of the exemplary control-circuit wafer 402 is illustrated. In FIG. 5, the carrier wafer 302 and control-circuit wafer are illustrated after an exemplary thinning of the control-circuit wafer 402, forming of channels 406 on the second side of the control-circuit wafer 402, and forming of vertical interconnects 408 through the control circuit wafer 402.

Returning to FIG. 2, step 210 of method 200 is to provide a sensor wafer. In general, the sensor wafer is a wafer that has been processed to form a plurality of MEMS sensors on at least a first side. These MEMS sensors can include any suitable type of configuration of MEMS sensors. For example, the MEMS sensors can include inertial sensors, such as gyroscopes and accelerometers. The MEMS sensors can also include other sensors such as pressure sensors. These MEMS sensors can be fabricated on any suitable type of die, using any suitable fabrication technique. In general, such MEMS sensors measure a change, for example, in electrical capacitance with respect to acceleration or other force. One exemplary form of MEMS sensors uses a sensing transducer with a movable element (or frame) that moves under acceleration above a reference substrate. The movement of the frame changes capacitance, and the MEMS accelerometer structure measures the change in capacitance to determine the acceleration forces.

Step 212 is to bond the sensor wafer to the control-circuit wafer. Specifically, the first side of the sensor wafer that includes the MEMS sensors is bonded to the second side of the control-circuit wafer. This bonding can again be performed using any suitable bonding agent and technique. It should be noted that during this bonding the electrical connections between the control-circuit wafer and the sensor wafer can be completed to provide connections between the MEMS sensors and the control circuits.

Additionally, in this step seal rings can be formed using the bonding agent. Specifically, the bonding agent can be used to form seal rings around the MEMS sensors to define a sealed chamber containing the MEMS sensor. In one embodiment, the bonding is performed in a vacuum, and thus each sealed chamber will contain a MEMS sensor sealed in a vacuum. In such an embodiment the vacuum in the sealed chamber can provide improved MEMS sensor performance, as the movable elements in the MEMS sensor can more easily move in the vacuum.

It also should be noted that bonding the sensor wafer to the control-circuit wafer at this point in method 200 can provide improved reliability of bonding. Specifically, although the control-circuit wafer has been thinned, it remains bonded to the carrier wafer. Thus, the control-circuit wafer/carrier wafer pair together provides a relatively thick and stable combination that can be reliably bonded to the sensor wafer. In contrast, if the thinned control-circuit wafer was not bonded to the carrier wafer, the bonding to the sensor wafer could not be performed with the same reliability. Thus, this step facilitates the reliable bonding of a thinned control-circuit wafer to the sensor wafer while also ultimately facilitating a relatively thin control-circuit die. This is notable because the formation of the control circuits on the first side of the control-circuit wafer prevents further thinning of the carrier wafer later in the process, and thus the relatively thin control-circuit die could not be facilitated using later thinning on the first side.

Turning briefly to FIG. 6, a cross-sectional view of the portion of the exemplary carrier wafer 302 and the portion of the exemplary control-circuit wafer 402 is illustrated. In FIG. 6 the carrier wafer 302 and control-circuit wafer are illustrated after an exemplary bonding of a sensor wafer 410 to the control circuit wafer 402. In this illustrated embodiment, the sensor wafer 410 includes a plurality of MEMS sensors 412. It should be noted that the MEMS sensors 412 are illustrated with simplified schematic representations, and that typical MEMS sensors would be significantly more complex than those illustrated in FIG. 6. Also, in this illustrated embodiment the sensor wafer 410 is bonded to the control-circuit wafer 402 using bonding agent 414. This bonding agent 414 is deposited to form a seal ring between the sensor wafer 410 and the control-circuit wafer 402. Thus, the bonding agent 414 and channels 406 define sealed chambers, with space provided for the MEMS sensors 412 to move in the sealed chambers.

Returning to FIG. 2, step 214 of method 200 is to thin the sensor wafer. The thinning of the sensor wafer can ultimately serve to make the final control-circuit die/sensor die pair thinner, and thus can reduce the overall size of the final MEMS sensor device. Such thinning can again be performed using any suitable process. For example, the thinning can be accomplished with a suitable abrasive-slurry grinding technique applied to the second side of the sensor wafer. In some embodiments it may also be desirable to thin the carrier wafer at this point. Again, such thinning can be done using any suitable process.

Turning briefly to FIG. 7, a cross-sectional view of the portion of the exemplary carrier wafer 302, the portion of the exemplary control-circuit wafer 402, and the portion of the exemplary sensor wafer 410 is illustrated after thinning of the sensor wafer 410 and the carrier wafer 302.

Returning to FIG. 2, step 216 of method 200 is to saw the carrier wafer at the die boundaries. In general, this sawing of the carrier wafer at the die boundaries is used to separate the carrier wafer from the control-circuit wafer. As noted above, in step 204 the carrier wafer was bonded to the control-circuit wafer with the bonding agent at the die boundaries. Thus, sawing the carrier wafer at these boundaries will also effectively remove the bonding agent, allowing the carrier wafer to separate from the control-circuit wafer. The step of sawing the carrier wafer at the die boundaries will generally involve making a plurality of saw cuts in a first direction, with one cut along each die boundary in the first direction, and then making a second plurality of saw cuts in a second, orthogonal direction, with one cut along each die boundary in the second direction. When such sawing is complete the carrier wafer can be picked up and removed from the control-circuit wafer.

Step 216 can be performed in a variety of ways. In one example, the sawing of the carrier wafer stops at the level of the bonding agent, and does not substantially extend into the control-circuit wafer. In those embodiments, the sawing of the carrier wafer serves only to separate the carrier wafer from the control-circuit wafer. In these embodiments, the control-circuit wafer and sensor wafer will need to be sawed later to singulate the wafer pair into die pairs for packaging.

In other embodiments, the sawing of the carrier wafer can continue through the control-circuit wafer and the sensor wafer. In those embodiments, the same sawing used to separate the carrier wafer from the control-circuit wafer is also used to singulate the wafer pair into individual die pairs.

In some embodiments, it may be desirable to apply tape to the carrier wafer as part of the sawing process. In those embodiments, the tape is used to hold the singulated carrier wafer die together so they can be more easily picked-up and removed from the fabrication frame after the sawing. In some embodiments, the tape is applied to the carrier wafer before the sawing, and in other embodiments the tape can be applied to the carrier wafer after the sawing in one direction but before the sawing in the second, orthogonal direction. In either case the tape can help keep the die together to make removal of the singulated die more reliable.

Figure 12:
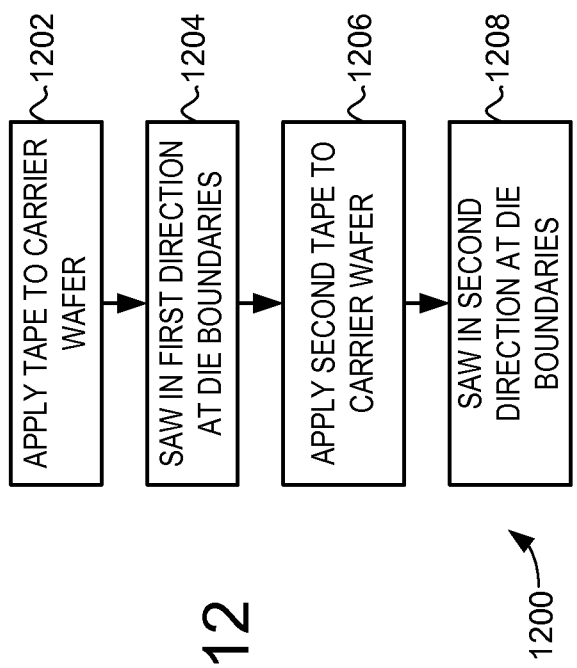
FIG. 12 is a flow diagram of a method for sawing wafers in forming a MEMS sensor device in accordance with an example embodiment.

One specific embodiment will be discussed with reference to FIG. 12, where a method is illustrated that uses multiple adhesive tape layers to keep the separated carrier wafer together during and after sawing.

Figure 9:
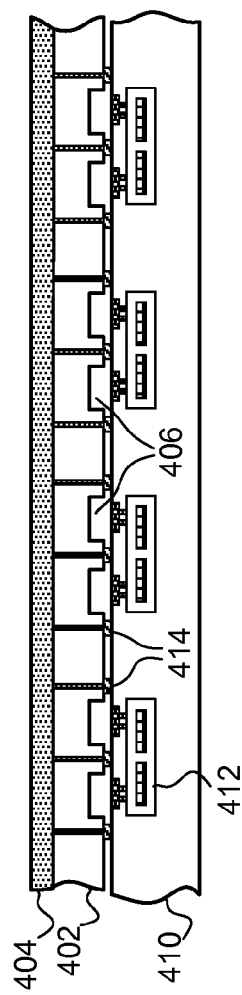

Turning now to FIGS. 8 and 9, a cross-sectional view of a portion of the exemplary carrier wafer 302, a portion of the exemplary control-circuit wafer 402, and portion of the exemplary sensor wafer 410 is illustrated. In FIG. 8, sawing paths 418 are represented by arrows that show the locations of the sawing paths 418 through the carrier wafer 302. These sawing paths 418 correspond to the die boundaries, and thus to the locations of the bonding agent 304 between the carrier wafer 302 and the control-circuit wafer 402. In FIG. 9, a portion of the exemplary control-circuit wafer 402 and portion of the exemplary sensor wafer 410 is illustrated after the sawing, separation and removal of the carrier wafer 302.

Again, sawing through the bonding agent 304 can serve to release the carrier wafer 302 from the control-circuit wafer 402. It should be noted that FIG. 8 illustrates only the sawing along the die boundaries in the first direction, and that such sawing would also typically be performed along the die boundaries in the second, orthogonal direction.

Also illustrated in FIG. 8 is a layer of adhesive tape 416 applied to the carrier wafer 302. The adhesive tape 416 can be used to hold the carrier wafer together after sawing to make pickup and removal of the carrier wafer easier. In such an embodiment, it may be desirable to not saw through the adhesive tape 416 in one or both of the orthogonal sawing directions when sawing to remove the carrier wafer. It may also be desirable to apply adhesive tape 416 after sawing in one direction but before sawing in the orthogonal direction, or to apply multiple layers of adhesive tape 416 with one layer applied after sawing in one direction and the second layer applied after sawing in the orthogonal direction.

Figure 10:
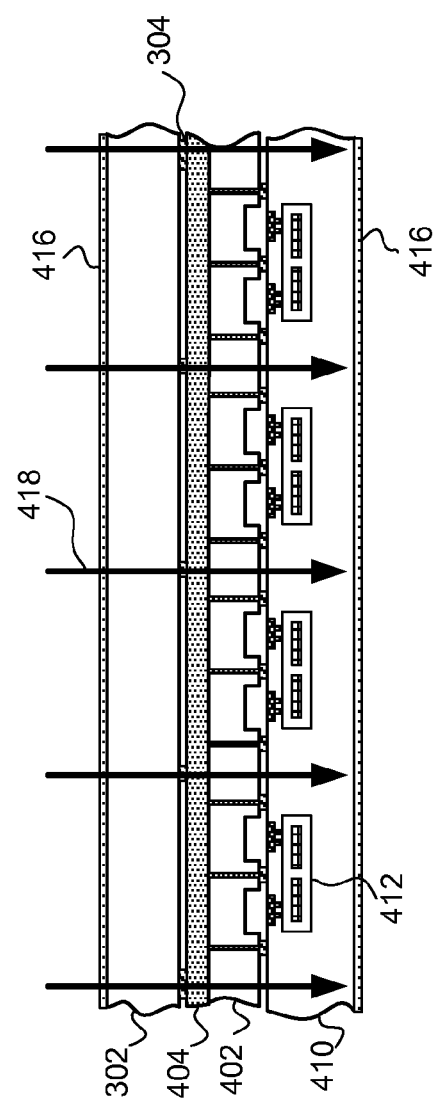

Turning now to FIG. 10, a cross-sectional view of a portion of the exemplary carrier wafer 302, a portion of the exemplary control-circuit wafer 402, and a portion of the exemplary sensor wafer 410 is illustrated. In FIG. 10, the sawing paths 418 again correspond to the die boundaries, and thus to the locations of the bonding agent 304 between the carrier wafer 302 and the control-circuit wafer 402. However, in this illustrated embodiment, the sawing paths 418 extend through the carrier wafer 302, the control-circuit wafer 402, and the sensor wafer 410. Such sawing would again remove the bonding agent 304, and thus separate the carrier wafer 302 from the control-circuit wafer 402. However, in this embodiment, such sawing would also saw through the control-circuit wafer 402 and the sensor wafer 410, and would thus serve to signulate the control-circuit/sensor wafer pair into individual die pairs. It should be noted that while the sawing paths 418 are illustrated as extending in the direction from the carrier wafer 302 to the control-circuit/sensor wafer pair, that in this embodiment the sawing could also occur in the opposite direction.

Also illustrated in FIG. 10 are layers of adhesive tape 416 applied to the carrier wafer 302 and the sensor wafer 410. The adhesive tape 416 layers can again serve to keep the carrier wafer and singulated control-circuit/sensor die pairs together after the sawing to make pick up and removal easier and more reliable. As such, in many cases it would be desirable for the sawing to stop before sawing through the adhesive tape 416. For example, the sawing can extend through the carrier wafer 302, the control-circuit wafer 402, and the sensor wafer 410 and stop before sawing through the adhesive tape 416 on the sensor wafer 410. Likewise, the sawing could be performed in the opposite direction and stop before extending through the adhesive tape 416 on the carrier wafer 302. In both cases the carrier wafer 302 can be removed from the singulated die pairs.

Returning to FIG. 2, step 218 of method 200 is to complete processing and packaging to complete the MEMS sensor device. In general, this can comprise any suitable processing and packaging techniques needed to complete the MEMS sensor device. For example, it can include any additional sawing needed to singulate the control-circuit wafer/sensor wafer pair into individual MEMS sensor device die pairs. Also, additional wiring or other connections can be formed to the die or to other associated devices. Finally, any suitable packaging of the MEMS sensor device die pair can be performed. For example, both air cavity and over molded packaging techniques can be used.

Figure 11:
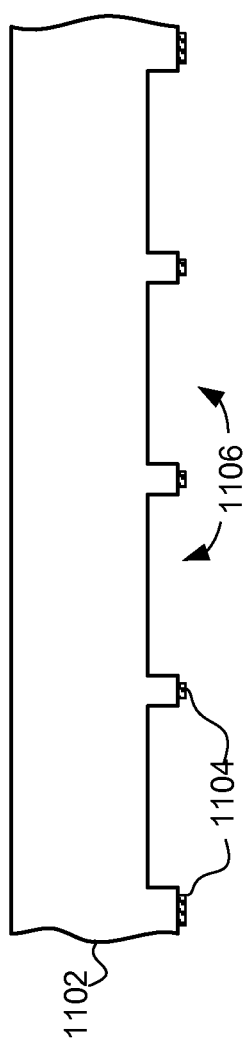

Turning to FIG. 11, a cross-sectional view of a second embodiment of a carrier wafer 1102 is illustrated. The carrier wafer 1102 is another example of the type of carrier wafer that can be used in method 200. In this embodiment, the carrier wafer 1102 includes channels 1106 formed on the carrier-wafer first side. The channels 1106 are formed to define ridges at the die boundaries, where bonding agent 1108 is applied for bonding to a control-circuit wafer (e.g., control-circuit wafer 402). As such, the channels 1106 facilitate the later release of the carrier wafer from the control-circuit wafer when the wafer pair is singulated.

As was described above, a variety of techniques can be used to saw the wafers to remove the carrier wafer from the control-circuit wafer/sensor wafer pair and singulate the control-circuit wafer/sensor wafer pair. Turning now to FIG. 12, a method 1200 is illustrated for sawing the wafers, and specifically for removing the carrier wafer from the control-circuit wafer/sensor wafer pair and singulating the control-circuit wafer/sensor wafer pair. As such, method 1200 can be considered to be a specific embodiment process for performing step 216 in the method 200. In step 1202 adhesive tape (e.g., adhesive tape 416) is applied to the carrier wafer (e.g., carrier wafer 302). In step 1204 the carrier wafer, the control-circuit wafer and the sensor wafer are sawed in the first direction at the die boundaries. In step 1206 a second layer of adhesive tape is applied to the carrier wafer. Then, in step 1208 the carrier wafer, the control-circuit wafer and the sensor wafer are sawed in the second direction at the boundaries, where the second direction is substantially orthogonal to the first direction.

In such a method, the two layers of tape will serve to facilitate keeping the carrier wafer together after separation from the control-circuit wafer, thus allowing the carrier wafer to more easily be picked up and removed from the control-circuit wafer. Furthermore, this process can help prevent individual pieces of the carrier wafer from being scattered about during or after the sawing process. As such, this method can improve the reliability of the process by reducing the chance of contamination occurring from pieces of the carrier wafer being scattered.

The various embodiments described herein can thus provide MEMS sensor devices with reduced size and improved performance and reliability. Specifically, the embodiments provide MEMS sensor devices with the control-circuit die and the sensor die bonded together, with the integrated MEMS control circuit formed on an active area of the control-circuit die. The control-circuit die is bonded to the sensor die with the active area and the integrated MEMS control circuits on the exterior side of the die pair. Configuring the MEMS sensor device with the a control circuits on an exterior side can provide a relatively compact device, as none of the available active area is required to be used for the seals and cavities that enclose the MEMS sensors. Furthermore, such a configuration can provide improved performance and reliability by facilitating the effective sealing of the MEMS sensor in a vacuum between the dies, where no significant outgassing from the control circuits will bleed into and affect the vacuum in the cavity.

Such MEMS sensor devices can be fabricated using a carrier wafer that is temporarily bonded to a control-circuit wafer. In general, this temporary bonding of the carrier wafer to the control-circuit wafer facilitates the arrangement of the control circuits and the active area on the exterior side of the bonded control-circuit wafer and the sensor wafer. Additionally, the use of the carrier wafer facilitates the thinning of the control-circuit wafer during fabrication, something that could otherwise not be accomplished with the control circuits and the active area on the exterior side of the bonded control-circuit wafer and the sensor wafer. Furthermore, because the bonding of the wafers occurs before thinning of the control-circuit wafer, this bonding can be performed with the wafers at full thickness, thus improving the reliability of the bonding process.

In one embodiment, a method of forming microelectromechanical systems (MEMS) device is provided that comprises: providing a carrier wafer having a carrier wafer first side and a carrier wafer second side; providing a control-circuit wafer having a control-circuit wafer first side and a control-circuit wafer second side, the control-circuit wafer including a plurality of integrated MEMS control circuits formed at the control-circuit wafer first side; bonding the carrier wafer first side to the control-circuit wafer first side with bonding agent applied at locations corresponding to die boundaries on the control-circuit wafer; providing a sensor wafer having a first side and second side, the sensor wafer including a plurality of MEMS sensors; bonding the sensor wafer first side to the control-circuit wafer second side; and sawing the carrier wafer through the bonding agent at the locations corresponding to the die boundaries to separate the carrier wafer from the control-circuit wafer.

In another embodiment, a method of forming microelectromechanical systems (MEMS) devices is provided that comprises: providing a carrier wafer having a carrier wafer first side and a carrier wafer second side; providing a control-circuit wafer having a control-circuit wafer first side and a control-circuit wafer second side, the control-circuit wafer including a plurality of integrated MEMS control circuits formed at the control-circuit wafer first side; bonding the carrier wafer first side to the control-circuit wafer first side with bonding agent applied at locations corresponding to die boundaries on the control-circuit wafer; thinning the control-circuit wafer by grinding the control-circuit wafer second side; forming a plurality interconnects from the control-circuit wafer second side to the control-circuit wafer first side to provide connections to the plurality of integrated MEMS control circuits; providing a sensor wafer having a first side and second side, the sensor wafer including a plurality of MEMS sensors; bonding the sensor wafer first side to the control-circuit wafer second side to form a plurality of sealed chambers, with each of the plurality of sealed chambers containing at least one of the plurality of MEMS sensors; and sawing the carrier wafer through the bonding agent at the locations corresponding to the die boundaries to separate the carrier wafer from the control-circuit wafer.

In another embodiment, a microelectromechanical systems (MEMS) device is provided that comprises: a control-circuit die having a control-circuit die first side and a control-circuit wafer second side, the control-circuit die including at least one integrated MEMS control circuit formed at the control-circuit die first side; and a sensor die having a first side and second side, the sensor die including at least one MEMS sensor formed at the sensor die first side, and wherein the sensor die first is bonded to the control-circuit second side.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

For the sake of brevity, conventional techniques related to microelectromechanical systems (MEMS) fabrication and development, MEMS sensing, electrical connections, analog circuit design, and other functional aspects of the systems (and the individual operating components of the systems) may not be described in detail herein. It should be understood that any circuitry described herein may be implemented either in silicon or another semiconductor material, or alternatively, by software code representation thereof.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of forming microelectromechanical systems (MEMS) devices comprising:
   providing a carrier wafer having a carrier wafer first side and a carrier wafer second side;
   providing a control-circuit wafer having a control-circuit wafer first side and a control-circuit wafer second side, the control-circuit wafer including a plurality of integrated MEMS control circuits formed at the control-circuit wafer first side;
   bonding the carrier wafer first side to the control-circuit wafer first side with bonding agent applied at locations corresponding to die boundaries on the control-circuit wafer;
   providing a sensor wafer having a first side and second side, the sensor wafer including a plurality of MEMS sensors;
   bonding the sensor wafer first side to the control-circuit wafer second side; and
   sawing the carrier wafer through the bonding agent at the locations corresponding to the die boundaries to separate the carrier wafer from the control-circuit wafer.

2. The method of claim 1 further comprising sawing through the control-circuit wafer and the sensor wafer during the sawing the carrier wafer.

3. The method of claim 1 wherein the step of sawing the carrier wafer stops at the sensor wafer.

4. The method of claim 1 wherein the step of sawing the carrier wafer comprises:
   applying a first layer of tape on the carrier wafer second side;
   sawing the first layer of tape and the carrier wafer in a first direction;
   applying a second layer of tape on the carrier wafer second side; and
   sawing the first layer of tape, the second layer of tape, and the carrier wafer in a second direction, the second direction orthogonal to the first direction.

5. The method of claim 1 wherein the step of bonding the sensor wafer first side to the control-circuit wafer second side comprises forming a plurality of bonding agent seal rings, each of the bonding agent seal rings defining a sealed chamber containing at least one plurality of MEMS sensors after the bonding of the sensor wafer first side to the control-circuit wafer second side.

6. The method of claim 1 further comprising the steps of:
   applying tape to the sensor wafer second side and applying tape to the carrier wafer first side prior to the step of sawing the carrier wafer.

7. The method of claim 1 further comprising the steps of:
   forming a plurality of channels on the carrier wafer first side prior to the step of bonding the carrier wafer first side to the control-circuit wafer first side.

8. The method of claim 1 further comprising the steps of:
   forming a plurality of channels on the carrier wafer first side prior to the step of bonding the carrier wafer first side to the control-circuit wafer first side, each of the plurality of channels defined by surrounding ridges, and where the surrounding ridges are at the locations corresponding to the die boundaries.

9. The method of claim 1 further comprising the step of:
   thinning the control-circuit wafer by grinding the control-circuit wafer second side after the step of bonding the carrier wafer first side to the control-circuit wafer first side.

10. The method of claim 1 further comprising the step of:
    thinning the carrier wafer by grinding the carrier wafer second side after the step of bonding the sensor wafer first side to the control-circuit wafer second side.

11. The method of claim 1 further comprising the step of:
    forming a plurality of vertical interconnects through the control-circuit wafer, the plurality of vertical interconnects extending from the control circuit wafer first side to the control circuit wafer second side to provide electrical connections between the plurality of MEMS sensors and the plurality of integrated MEMS control circuits.

12. The method of claim 1 further comprising the steps of:
    forming a plurality of channels on the control-circuit wafer second side.

13. A method of forming microelectromechanical systems (MEMS) devices comprising:
    providing a carrier wafer having a carrier wafer first side and a carrier wafer second side;
    providing a control-circuit wafer having a control-circuit wafer first side and a control-circuit wafer second side, the control-circuit wafer including a plurality of integrated MEMS control circuits formed at the control-circuit wafer first side;
    bonding the carrier wafer first side to the control-circuit wafer first side with bonding agent applied at locations corresponding to die boundaries on the control-circuit wafer;
    thinning the control-circuit wafer by grinding the control-circuit wafer second side;
    forming a plurality interconnects from the control-circuit wafer second side to the control-circuit wafer first side to provide connections to the plurality of integrated MEMS control circuits;
    providing a sensor wafer having a first side and second side, the sensor wafer including a plurality of MEMS sensors;
    bonding the sensor wafer first side to the control-circuit wafer second side to form a plurality of sealed chambers, with each of the plurality of sealed chambers containing at least one of the plurality of MEMS sensors; and
    sawing the carrier wafer through the bonding agent at the locations corresponding to the die boundaries to separate the carrier wafer from the control-circuit wafer.

14. The method of claim 13 further comprising sawing through the control-circuit wafer and the sensor wafer during the sawing the carrier wafer.

15. The method of claim 13 wherein the step of sawing the carrier wafer does not further saw into the sensor wafer.

16. A microelectromechanical systems (MEMS) device comprising:
    a control-circuit die having a control-circuit die first side and a control-circuit wafer second side, the control-circuit die including at least one integrated MEMS control circuit formed at the control-circuit die first side; and
    a sensor die having a first side and second side, the sensor die including at least one MEMS sensor formed at the sensor die first side, and wherein the sensor die first is bonded to the control-circuit second side.

17. The MEMS device of claim 16 further comprising:
    a plurality of vertical interconnects in the control-circuit die, the plurality of vertical interconnects extending from the control circuit die first side to the control circuit die second side to provide electrical connections between at the at least one MEMS sensor and the at least one integrated MEMS control circuit.

18. The MEMS device of claim 16 further comprising a cavity formed at the control-circuit die second side, the cavity defined by a plurality of surrounding ridges in the control-circuit die.

19. The MEMS device of claim 16 further comprising a package containing the control-circuit die and the sensor die.

20. The MEMS device of claim 16 further comprising a seal ring between the control-circuit die and the sensor die, the seal ring including bonding agent to and defining a sealed chamber containing the at least one MEMS sensor.

* * * * *